(12) United States Patent
Watanabe et al.

(10) Patent No.: US 12,289,045 B2
(45) Date of Patent: Apr. 29, 2025

(54) POWER CONVERSION DEVICE, SEMICONDUCTOR SWITCH DRIVE DEVICE, AND CONTROL METHOD

(71) Applicant: TOSHIBA MITSUBISHI-ELECTRIC INDUSTRIAL SYSTEMS CORPORATION, Chuo-ku (JP)

(72) Inventors: Fumio Watanabe, Tokyo (JP); Tetsuya Okamoto, Tokyo (JP)

(73) Assignee: TMEIC CORPORATION, Chuo-ku (JP)

( * ) Notice: Subject to any disclaimer, the term of this patent is extended or adjusted under 35 U.S.C. 154(b) by 247 days.

(21) Appl. No.: 17/996,532

(22) PCT Filed: May 12, 2020

(86) PCT No.: PCT/JP2020/018943
§ 371 (c)(1),
(2) Date: Oct. 19, 2022

(87) PCT Pub. No.: WO2021/229676
PCT Pub. Date: Nov. 18, 2021

(65) Prior Publication Data
US 2023/0208275 A1    Jun. 29, 2023

(51) Int. Cl.
*H02M 1/08* (2006.01)
*H02M 7/539* (2006.01)
(Continued)

(52) U.S. Cl.
CPC ............ *H02M 1/08* (2013.01); *H02M 7/539* (2013.01); *H03K 17/08128* (2013.01); *H02P 27/06* (2013.01)

(58) Field of Classification Search
CPC .................... H02M 1/08; H03K 17/08128
See application file for complete search history.

(56) References Cited

U.S. PATENT DOCUMENTS 7,977,889 B2    7/2011  Kumagai et al.
2004/0201935 A1*  10/2004  Yamamoto ......... H03K 17/0828
                                            361/93.1
(Continued)

FOREIGN PATENT DOCUMENTS

CN    103582993 A  *  2/2014  .............. H02M 1/08
CN    106374731 A  *  2/2017
(Continued)

OTHER PUBLICATIONS

Office Action issued Aug. 9, 2024, in corresponding Indian Patent Application No. 202217059618 (with English Translation), 5 pages.

*Primary Examiner* — Sisay G Tiku
(74) *Attorney, Agent, or Firm* — Oblon, McClelland, Maier & Neustadt, L.L.P.

(57) ABSTRACT

A semiconductor switch drive device (3) includes a drive unit (10), a power supply unit (20), a switch (39), and a control unit (50). The drive unit (10) supplies a control signal to a semiconductor switch (Q) of a main circuit (2) and drives the semiconductor switch (Q). The power supply unit (20) supplies electric power to the drive unit (10). The switch (39) cuts off supply of electric power to the power supply unit (20) by detecting or controlling an overvoltage state on a primary side of the power supply unit (20). The control unit (50) switches a conductive state of the switch (39) on the basis of a voltage of a control terminal of the semiconductor switch (Q).

9 Claims, 4 Drawing Sheets

(51) Int. Cl.
*H03K 17/0812* (2006.01)
*H02P 27/06* (2006.01)

(56) References Cited

U.S. PATENT DOCUMENTS

| | | | | |
|---|---|---|---|---|
| 2017/0222428 | A1* | 8/2017 | Choi | H01H 47/325 |
| 2018/0316182 | A1* | 11/2018 | Minagawa | H03K 17/0828 |
| 2019/0157968 | A1* | 5/2019 | Tsuchiya | H02M 7/12 |
| 2019/0254135 | A1* | 8/2019 | Miyake | H05B 47/20 |
| 2019/0296731 | A1* | 9/2019 | Sakai | H01L 24/49 |
| 2021/0218345 | A1* | 7/2021 | Yamaguchi | H02M 1/322 |
| 2023/0283273 | A1* | 9/2023 | Morini | H03K 17/0822 |
| | | | | 361/93.9 |

FOREIGN PATENT DOCUMENTS

| | | | | |
|---|---|---|---|---|
| CN | 209267544 | U * | 8/2019 | |
| CN | 115102137 | A * | 9/2022 | |
| JP | 2007-236126 | A | 9/2007 | |
| JP | 2016-127737 | A | 7/2016 | |
| JP | 6618081 | B2 * | 12/2019 | |
| JP | 7279831 | B1 * | 5/2023 | |
| WO | WO-2022158052 | A1 * | 7/2022 | H02M 1/0009 |

* cited by examiner

POWER CONVERSION DEVICE, SEMICONDUCTOR SWITCH DRIVE DEVICE, AND CONTROL METHOD

TECHNICAL FIELD

The present invention relates to a power conversion device, a semiconductor switch drive device, and a control method.

BACKGROUND ART

A semiconductor switch used in a power conversion device is driven by a semiconductor switch drive device. The semiconductor switch drive device stabilizes an off state of the semiconductor switch by applying a negative bias voltage for a common potential to a control terminal of the semiconductor switch. Incidentally, when the semiconductor switch fails, a failure state (a control terminal short-circuit failure) in which the control terminal of the semiconductor switch and a terminal having a common potential (one terminal of a secondary-side circuit) are short-circuited may occur. For example, in the case of an insulated gate bipolar transistor (IGBT), a failure state in which a gate and an emitter are short-circuited (a control terminal short-circuit failure) may occur. When the above control terminal short-circuit failure occurs, an abnormal electric current may flow through the semiconductor switch drive device due to the short-circuit failure.

CITATION LIST

Patent Literature

Patent Literature 1

Japanese Unexamined Patent Application, First Publication No. 2016-127737

SUMMARY OF INVENTION

Technical Problem

An objective of the present invention is to provide a power conversion device, a semiconductor switch drive device, and a control method capable of cutting off an abnormal electric current due to a control terminal short-circuit failure in a semiconductor switch.

Solution to Problem

According to the present invention, a semiconductor switch drive device includes a drive unit, a power supply unit, a switch, and a control unit. The drive unit supplies a control signal to a semiconductor switch of a main circuit and drives the semiconductor switch. The power supply unit supplies electric power to the drive unit. The switch cuts off supply of electric power to the power supply unit by detecting or controlling an overvoltage state on a primary side of the power supply unit. The control unit switches a conductive state of the switch on the basis of a voltage of a control terminal of the semiconductor switch.

DESCRIPTION OF EMBODIMENTS

Hereinafter, a power conversion device, a semiconductor switch drive device, and a control method according to embodiments will be described. Also, the term "connection" mentioned in the present description is not limited to a case of a physical connection and also includes an electrical connection. Also, the term "based on XX" mentioned in the present description means "at least based on XX" and also includes a case based on another element in addition to XX. Furthermore, the term "based on XX" is not limited to a case in which XX is directly used and includes a case based on calculation or processing performed on XX. "XX" is any element (for example, any information). Also, components having the same or similar functions are denoted by the same reference signs.

First Embodiment

First, a power conversion device 1 according to the embodiment will be described.

Figure 1A:
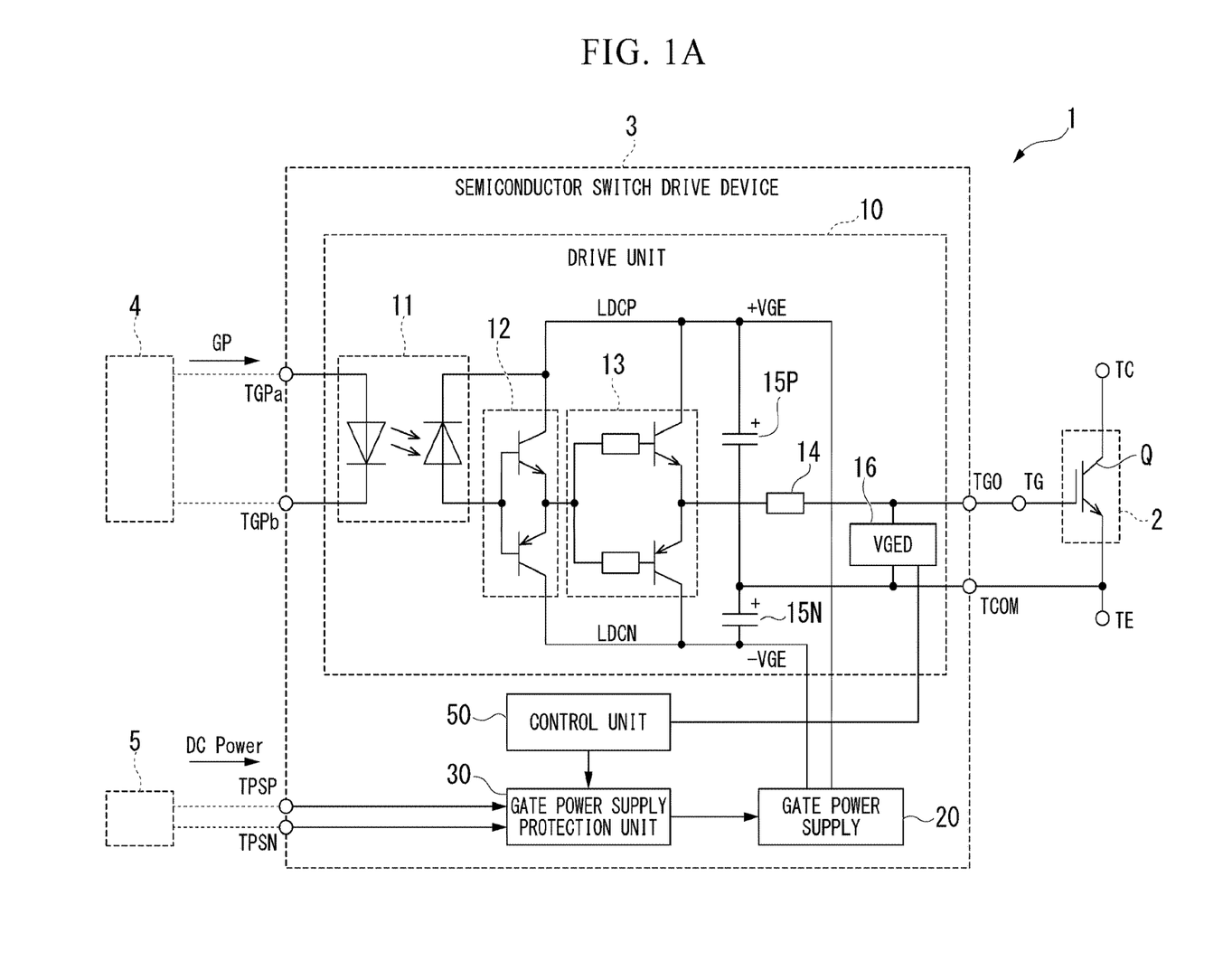
FIG. 1A is a configuration diagram of a power conversion device according to a first embodiment.

FIG. 1A is a schematic configuration diagram of the power conversion device 1 according to the embodiment.

The power conversion device 1 includes a main circuit unit 2 and a semiconductor switch drive device 3.

The main circuit unit 2 shown in FIG. 1A includes, for example, one or more semiconductor switches Q. Although an insulated gate bipolar transistor (IGBT) is exemplified as a type of the semiconductor switch Q, the present invention is not limited thereto. Other types of semiconductor switches may be used. Terminals TC, TE, and TG used as electrodes are provided in the main circuit unit 2. For example, the terminals TC, TE, and TG are connected to a semiconductor switch body, for example, a collector, an emitter, and a gate of the IGBT, respectively, inside a housing of the main circuit unit 2. An emitter potential of the semiconductor switch Q, i.e., a potential of the terminal TE of the main circuit unit 2, is used as a reference potential. A more specific configuration of the main circuit unit 2 will be described below.

The semiconductor switch drive device 3 includes a drive circuit 10 (a drive unit), a gate power supply 20 (a power supply unit), a gate power supply protection unit 30, and a control unit 50. For example, the semiconductor switch drive device 3 includes a pair of signal terminals TGPa and TGPb, a pair of power supply terminals TPSP and TPSN, a terminal TCOM, and a terminal TGO. The pair of the signal terminals TGPa and TGPb is connected to an output of the control device 4 and a gate pulse GP is supplied. DC power is supplied from the DC power supply 5 to the pair of the power supply terminals TPSP and TPSN. The terminal TCOM is a terminal connected to the terminal TE and having the reference potential of the semiconductor switch drive device 3. The terminal TGO is connected to the terminal TG and outputs an output signal of the semiconductor switch drive device 3, so that the output signal is supplied to the terminal TG.

For example, the DC power supplied from the DC power supply 5 to the pair of the power supply terminals TPSP and the TPSN is supplied to the gate power supply 20 via the gate power supply protection unit 30. The gate power supply 20 includes a stabilized power supply circuit and converts the DC power into bipolar DC power of a positive voltage +VGE and a negative voltage −VGE on the basis of the supplied DC power. The gate power supply 20 supplies a positive voltage +VGE and a negative voltage −VGE to a positive electrode side electrode LDCP and a negative electrode side electrode LDCN of the drive circuit 10, respectively. An output side of the gate power supply 20 is insulated from a power supply of the main circuit unit 2. Details of the gate power supply protection unit 30 will be described below.

The drive circuit 10 includes a photocoupler 11, a level conversion circuit 12, a power amplification circuit 13, a resistor 14, capacitors 15P and 15N, and a voltage detection unit 16 (which is shown as VGED in FIG. 1A).

An input of the photocoupler 11 is connected to the pair of the signal terminals TGPa and TGPb. The photocoupler 11 includes a pair of an LED on the input side and a photodiode on the output side and the input and the output of the photocoupler 11 are insulated from each other. The photocoupler 11 converts a gate pulse GP supplied to the pair of the signal terminals TGPa and TGPb into an electrical signal for output using the electric power from the gate power supply 20.

An input of the level conversion circuit 12 is connected to an output of the photocoupler 11. Output impedance and a signal level associated with the electrical signal output from the photocoupler 11 are converted by the level conversion circuit 12.

For example, the level conversion circuit 12 includes a push-pull transistor pair whose collectors are connected to the positive electrode side electrode LDCP and the negative electrode side electrode LDCN, respectively. Bases of the push-pull transistor pair are connected to the output of the photocoupler 11 (an anode of the photodiode). The potential of each base is a potential which is a reverse bias voltage of the photodiode lower than the positive voltage +VGE. Thereby, the level conversion circuit 12 outputs an electrical signal converted into a voltage between the direct current of the negative voltage −VGE and the positive voltage +VGE.

The power amplification circuit 13 includes, for example, a push-pull transistor pair connected to the positive electrode side electrode LDCP and the negative electrode side electrode LDCN. The input of the power amplification circuit 13 is connected to the output of the level conversion circuit 12. The output impedance is converted and the electric power of the electrical signal output from the level conversion circuit 12 is amplified by the power amplification circuit 13. The power amplification circuit 13 outputs an electrical signal having an amplitude between the negative voltage −VGE and the positive voltage +VGE. The output of the power amplification circuit 13 is connected to the gate of the semiconductor switch Q via the resistor 14 and the terminal TG and a voltage generated by the photocoupler 11 is output to the gate of the semiconductor switch Q at a voltage between the direct current of the negative voltage −VGE and the positive voltage +VGE.

The capacitor 15P is connected to the positive electrode side electrode LDCP and the terminal TG. The capacitor 15N is provided between the negative electrode side electrode LDCN and the terminal TG. The capacitors 15P and 15N are bypass capacitors for the power supply.

The voltage detection unit 16 detects a potential difference between the terminal TCOM and the terminal TGO (between the terminal TE and the terminal TG), i.e., a gate voltage of the semiconductor switch Q. The voltage detection unit 16 supplies the detection result of the gate voltage of the semiconductor switch Q to the control unit 50. The control unit 50 controls the gate power supply protection unit 30 on the basis of a result of detecting the gate voltage of the semiconductor switch Q.

For example, when the gate pulse GP is supplied to the signal terminals TGPa and TGPb, i.e., when a prescribed potential difference corresponding to the gate pulse GP is generated in the pair of the signal terminals TGPa and TGPb, the photocoupler 11 detects the prescribed potential difference and outputs an electrical signal having a relatively high potential with respect to the reference potential. The electrical signal of the relatively high potential indicates a state in which an anode potential of the photodiode of the photocoupler 11 is relatively high with respect to the reference potential. The level conversion circuit 12 and the power amplification circuit 13 output an electrical signal having a potential according to the electrical signal of the relatively high potential and apply the electrical signal to the gate of the semiconductor switch Q. At this time, the gate potential of the semiconductor switch Q is positively biased and the semiconductor switch Q is turned on.

When the gate pulse GP is not supplied to the signal terminals TGPa and TGPb, i.e., when a prescribed potential difference does not occur in the pair of the signal terminals TGPa and TGPb, the photocoupler 11 detects the absence of the gate pulse GP, i.e., the absence of the prescribed potential difference, and outputs an electrical signal having a relatively low potential. The level conversion circuit 12 and the power amplification circuit 13 output an electrical signal having a potential according to the electrical signal having a relatively low potential and apply the electrical signal to the gate of the semiconductor switch Q. At this time, the gate potential of the semiconductor switch Q is negatively biased and the semiconductor switch Q is turned off.

Figure 1B:
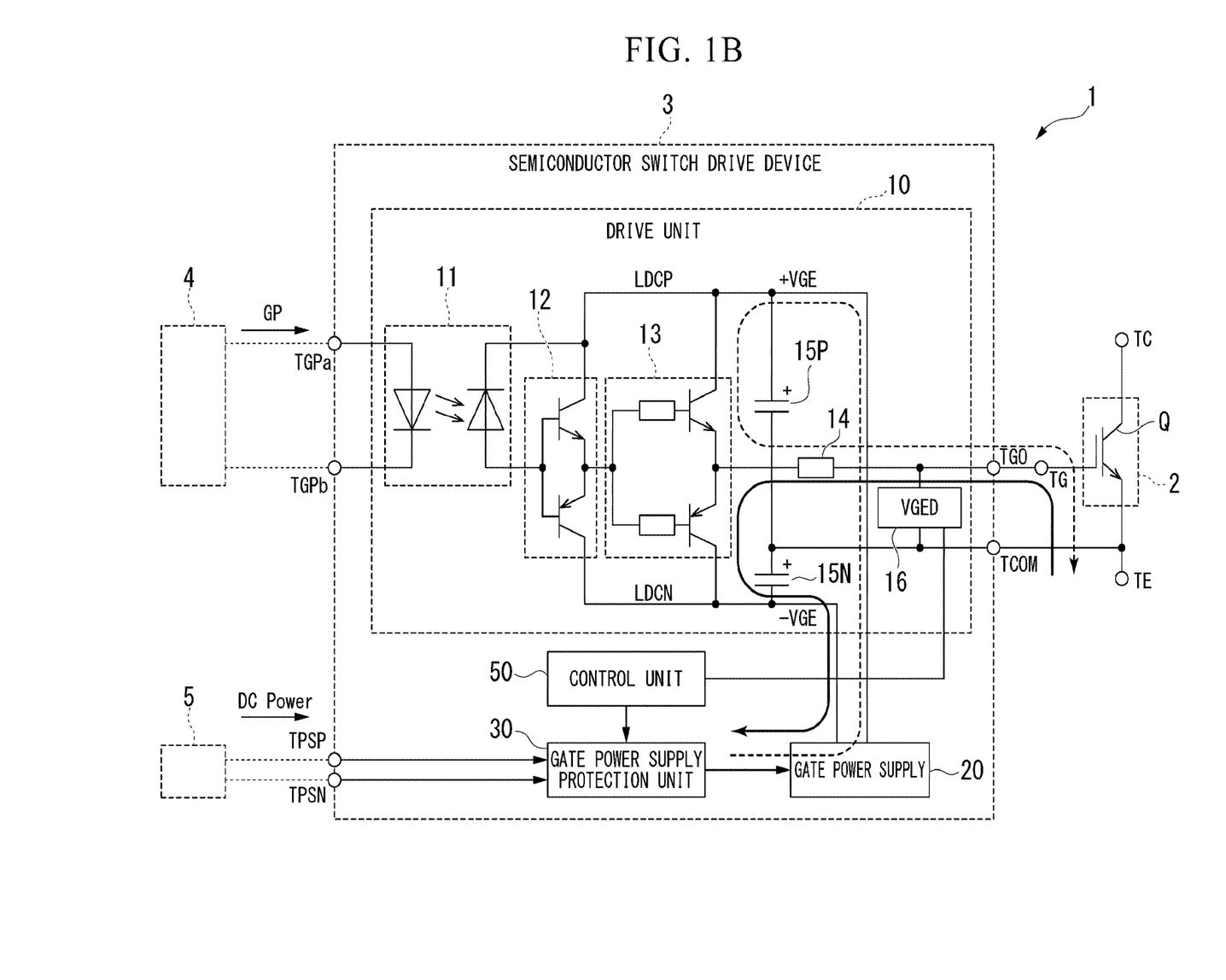
FIG. 1B is a diagram for describing a short-circuit failure in the semiconductor switch according to the first embodiment.

FIG. 1B is a diagram for describing a short-circuit failure in the semiconductor switch Q according to the embodiment.

The semiconductor switch Q may be in a failure state (referred to as a control terminal short circuit failure) in which the gate and the emitter, in other words, the terminal TG (a control terminal) and the terminal TE (a terminal having a common potential), are short-circuited. If the gate and the emitter of the semiconductor switch Q are short-circuited, a short-circuit current may flow when the semiconductor switch Q is controlled so that the semiconductor switch Q is turned on in accordance with the gate pulse or when there is no gate pulse and the semiconductor switch Q is controlled so that the semiconductor switch Q is turned off, as indicated by the arrow shown in FIG. 1B.

Figure 2:
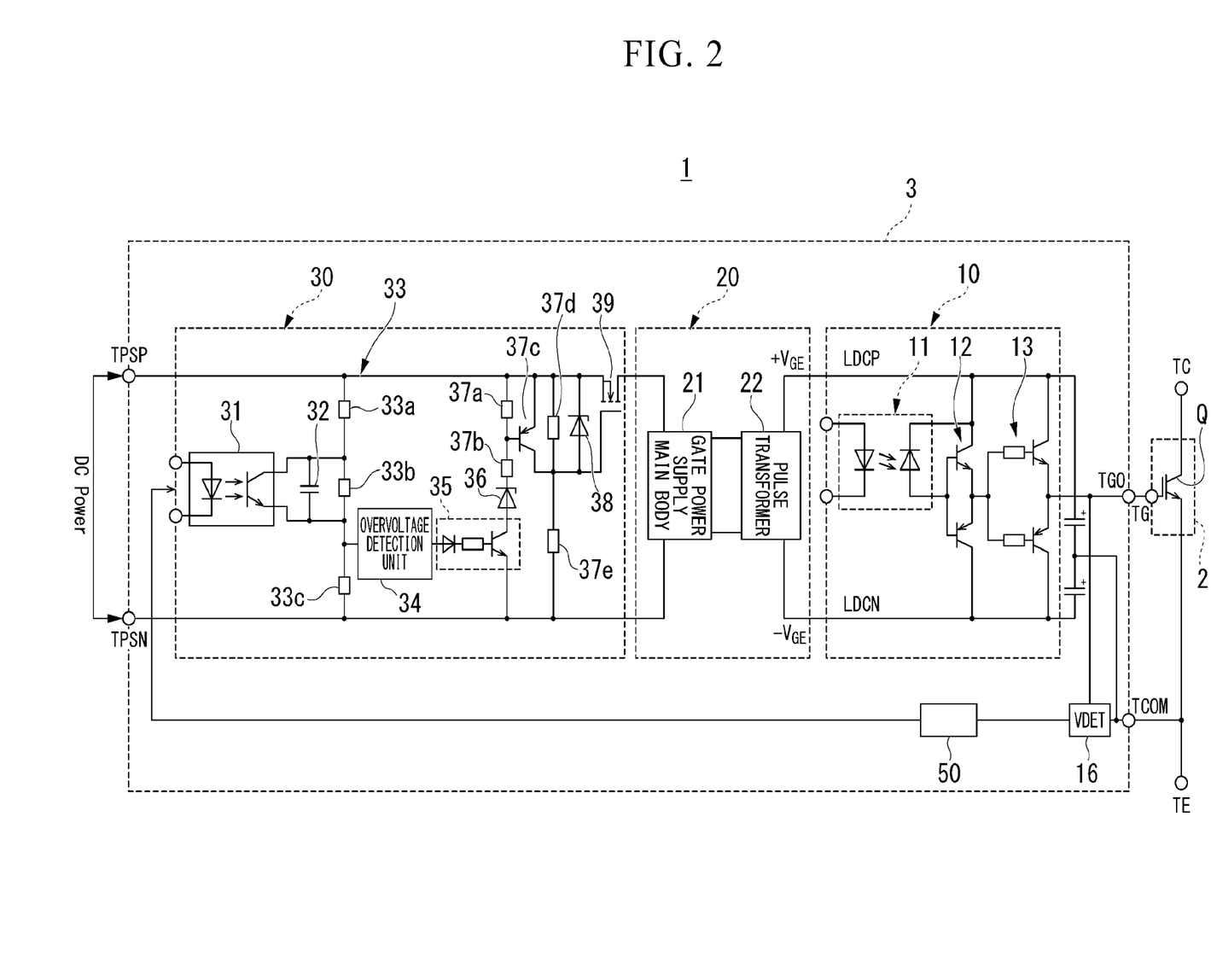
FIG. 2 is a configuration diagram of a gate power supply protection unit according to the first embodiment.

The gate power supply protection unit 30 according to the embodiment will be described with reference to FIG. 2. FIG. 2 is a configuration diagram of the gate power supply protection unit 30 according to the embodiment.

The gate power supply protection unit 30 includes a photocoupler 31, a capacitor 32, a voltage dividing resistor 33, an overvoltage detection unit 34, a current amplification circuit 35, a constant voltage diode 36, a bias circuit 37, a constant voltage diode 38, and a switch 39.

The input of the photocoupler 31 is connected to the output of the control unit 50. The photocoupler 31 includes a set of an LED on the input side and a phototransistor on the output side, and the input and the output of the photocoupler 31 are insulated from each other. The photocoupler 31 receives a cutoff control signal output by the control unit 50 and controls an on/off state of the phototransistor on the basis of the cutoff control signal. For example, the phototransistor is turned on when the logic of the cutoff control signal is 1 and is turned off when the logic of the cutoff control signal is 0.

The capacitor 32 is connected in parallel to the output of the photocoupler 31 and limits a steep change in the voltage when the on/off state of the output of the photocoupler 31 is switched.

The voltage dividing resistor 33 includes resistors 33a to 33c connected in series. Both ends of the voltage dividing resistor 33 are connected to a terminal TPSP and a terminal TPSN, respectively. The voltage dividing resistor 33 divides a voltage applied between the terminal TPSP and the terminal TPSN. The output of the photocoupler 31 and the capacitor 32 are connected in parallel to both ends of the resistor 33b. A comparative voltage for overvoltage detection is generated according to a voltage division ratio of the voltage dividing resistor 33.

For example, the overvoltage detection unit 34 detects a voltage generated across the resistor 33c and compares the voltage with a predetermined threshold voltage. The overvoltage detection unit 34 determines that the voltage generated across the resistor 33c is an overvoltage when the voltage is higher than a threshold voltage and determines that the voltage is a voltage at a normal time when the voltage is lower than the threshold voltage. The overvoltage detection unit 34 outputs a low level (0) when an overvoltage has been detected and outputs a high level (1) when the voltage at a normal time has been detected.

The current amplification circuit 35 includes an NPN transistor. In the current amplification circuit 35, the NPN transistor is turned on and a collector current flows through a circuit in the subsequent stage when the overvoltage detection unit 34 outputs the high level (1). In the current amplification circuit 35, the NPN transistor is turned off and the collector current is stopped when the overvoltage detection unit 34 outputs a low level (0). As described above, the current amplification circuit 35 stops the collector current of the NPN transistor when the overvoltage is detected by the overvoltage detection unit 34.

The constant voltage diode 36 is connected in series to the collector of the NPN transistor of the current amplification circuit 35. When the current amplification circuit 35 allows the collector current of the NPN transistor to flow, the constant voltage diode 36 is in a reverse-biased state and a predetermined breakdown voltage is generated across the constant voltage diode 36. The above voltage is used as a threshold value for detecting an undervoltage state of a power supply voltage.

The bias circuit 37 includes, for example, voltage dividing resistors 37a and 37b, a transistor 37c, and voltage dividing resistors 37d and 37e.

The voltage dividing resistors 37a and 37b are connected in series to each other to form a voltage dividing resistor. One end of the voltage dividing resistor 37a is connected to the terminal TPSP. One end of the voltage dividing resistor 37b is connected to a cathode of the constant voltage diode 36. A base of a transistor 37c (a PNP transistor) is connected to a connection point at the other ends of the voltage dividing resistors 37a and 37b. For example, when the NPN transistor of the current amplification circuit 35 is turned on and a voltage exceeding the breakdown voltage of the constant voltage diode 36 is applied between the terminal TPSP and the terminal TPSN, the collector current flows through the NPN transistor of the current amplification circuit 35 and a base potential at which the transistor 37c is turned on is generated at the above connection point. Thereby, the transistor 37c is turned on. Under conditions other than the above, the transistor 37c is turned off.

The voltage dividing resistors 37d and 37e are connected in series to each other to form a voltage dividing resistor. One end of the voltage dividing resistor 37d is connected to the terminal TPSP and one end of the voltage dividing resistor 37e is connected to the terminal TPSN. The voltage dividing resistors 37d and 37e divide the voltage applied between the terminal TPSP and the terminal TPSN when not limited to other circuit elements. Further, the voltage dividing resistor 37d is connected in parallel between the emitter and the collector of the transistor 37c, between both ends of the constant voltage diode 38 to be described below, and between the gate and the source of the switch 39.

The constant voltage diode 38 limits the gate-source voltage of the switch 39 so that the gate-source voltage of the switch 39 does not exceed its breakdown voltage.

The switch 39 is, for example, a semiconductor switch. More specifically, the switch 39 is a MOSFET. The source of the switch 39 is connected to the terminal TPSP and the drain thereof is connected to the gate power supply 20 in the subsequent stage. According to the on/off control of the switch 39, it is determined whether or not electric power can be supplied to the gate power supply 20. The gate of the switch 39 is connected to the collector of the transistor 37c.

As described above, the gate-source voltage of the switch 39 is controlled by the transistor 37c. For example, when the transistor 37c is tuned off, the gate-source voltage of the switch 39 is negatively biased by a voltage division ratio of the voltage dividing resistors 37d and 37e or by a voltage determined by the breakdown voltage of the constant voltage diode 38. Thereby, if the potential of the gate terminal is lower than the potential of the source terminal of the switch 39, the switch 39 is turned off. If the potential of the gate terminal is equal to or higher than the potential of the source terminal of the switch 39, the switch 39 is turned on. In the latter case, the switch 39 is in a state in which electric power can be supplied to the gate power supply 20.

As described above, the semiconductor switch drive device 3 cuts off the supply of electric power to the gate power supply 20 using the gate power supply protection unit 30 when the power supply voltage is insufficient or an overvoltage. Further, the semiconductor switch drive device 3 uses the gate power supply protection unit 30 to cut off the supply of the electric power at the time of the short-circuit failure in the semiconductor switch Q. This will be described below.

When an on/off state of the phototransistor of the photocoupler 31 is controlled according to a cutoff control signal from the control unit 50, the voltage division ratio of the voltage dividing resistor 33 changes. For example, if the phototransistor of the photocoupler 31 is turned off, the voltage division ratio of the voltage dividing resistors 33 is determined by the resistors 33a to 33c. On the other hand, when the phototransistor of the photocoupler 31 is turned on, the voltage division ratio of the voltage dividing resistor 33 is determined by the resistor 33a and the resistor 33c. As described above, when the phototransistor of the photocoupler 31 is turned on, the voltage of the resistor 33c when the voltage is divided according to the voltage division ratio determined by the resistor 33a and the resistor 33c is higher than that when the above transistor is turned off.

The overvoltage detection unit 34 detects the voltage of the resistor 33c set to be increased according to the cutoff control signal from the control unit 50 as described above as if an overvoltage state has occurred even if the resistor 33c is not in an overvoltage state. Thereby, the overvoltage detection unit 34 outputs a low level (0) so that the switch 39 is turned off as in the case of overvoltage detection. The following description of the operation is similar to that at the time of overvoltage detection. Thereby, the switch 39 is controlled so that the switch 39 is turned off, and the electric current flowing through the control terminal of the semiconductor switch Q can be cut off.

Also, because the gate power supply 20 transmits AC power to the secondary side via the pulse transformer 22 at a normal time, but the electric power supplied to the primary side of the gate power supply 20 disappears when the switch 39 is controlled so that the switch 39 is turned off, the electric power transmitted to the secondary side also similarly disappears. Thereby, the electric current flowing from the drive circuit 10 can be cut off at the failure point where the short-circuit failure has occurred in the semiconductor switch Q.

According to the above-described embodiment, the control unit 50 switches the conductive state of the switch 39 of the gate power supply protection unit 30 on the basis of the voltage (the gate voltage) of the gate (the control terminal) of the semiconductor switch Q. The switch 39 of the gate power supply protection unit 30 cuts off the supply of the electric power to the gate power supply 20 by detecting or controlling an overvoltage state on the primary side of the gate power supply 20. Thereby, the abnormal electric current due to the control terminal short-circuit failure in the semiconductor switch Q can be cut off.

The drive circuit 10 negatively biases a gate control signal of the semiconductor switch Q when the semiconductor switch Q is turned off. When the voltage of the gate control signal when the semiconductor switch Q is turned off is less than a prescribed value, the control unit 50 can interrupt the control for the semiconductor switch Q in which a short-circuit failure occurs by causing the switch 39 to cut off the supply of the electric power to the gate power supply 20.

The drive circuit 10 negatively biases the gate control signal when the semiconductor switch Q is turned off at the normal time. There is provided a power conversion device in which the control unit 50 causes the switch to cut off the supply of the electric power to the gate power supply 20 if the voltage of the gate control signal when the semiconductor switch Q is turned off is smaller than a prescribed value determined with respect to the voltage at the normal time. A case in which the voltage of the gate control signal is smaller than a prescribed value may be a case in which an absolute value of the voltage of the gate control signal is smaller than a prescribed value that has been predetermined.

Modified Example of First Embodiment

Although the schematic configuration of the main circuit unit 2 has been described in the first embodiment, a more specific configuration example will be shown in a modified example.

Figure 3:
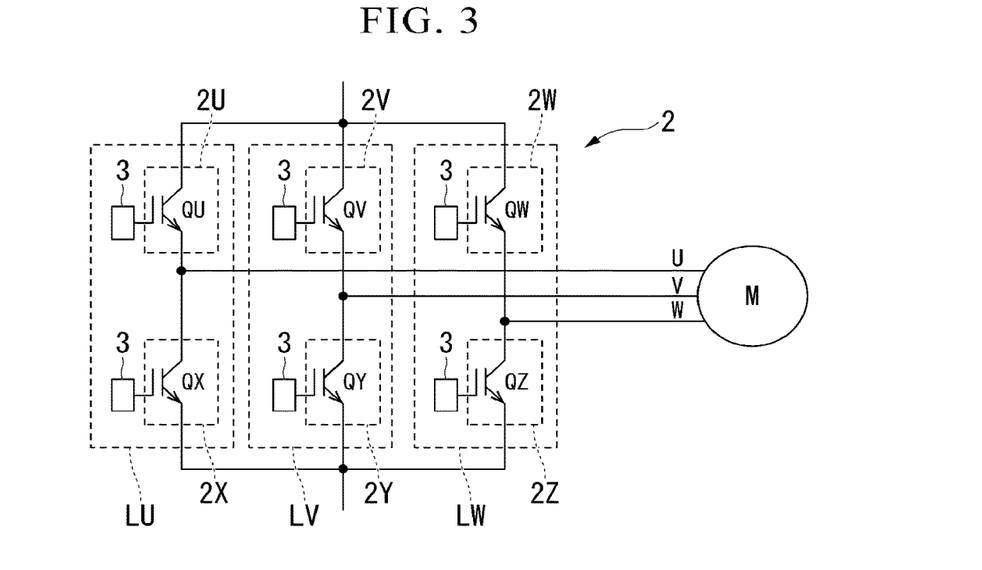
FIG. 3 is a configuration diagram of a main circuit unit of the power conversion device according to the first embodiment.

FIG. 3 is a configuration diagram of the main circuit unit 2 of the modified example.

The main circuit unit 2 includes, for example, legs LU to LW. The main circuit unit 2 converts DC power into three-phase AC power. The legs LU to LW are similarly configured and are associated with U-, V-, and W-phase windings (not shown) of the motor M, respectively. The main circuit unit 2 supplies three-phase AC power to a motor M.

The leg LU includes semiconductor switches QU and QX and two semiconductor switch drive devices 3. The leg LV includes semiconductor switches QV and QY and two semiconductor switch drive devices 3. The leg LW includes semiconductor switches QW and QZ and two semiconductor switch drive devices 3. Here, a configuration of each leg will be described on behalf of the leg LU.

The semiconductor switches QU and QX are switching elements of the same type and an IGBT is exemplified here. The semiconductor switches QU and QX are connected in series on the switch side and the semiconductor switch QU is provided on the positive electrode side (referred to as a p-side) and the semiconductor switch QX is provided on the negative electrode side (referred to as an n-side).

The outputs of the semiconductor switch drive devices 3 are connected to the gates of the semiconductor switches QU and QX of the semiconductor switches QU and QX.

The above configuration example is an example and the present invention is not limited to the configuration shown in FIG. 3. The configuration may be appropriately changed.

Second Embodiment

Figure 4:
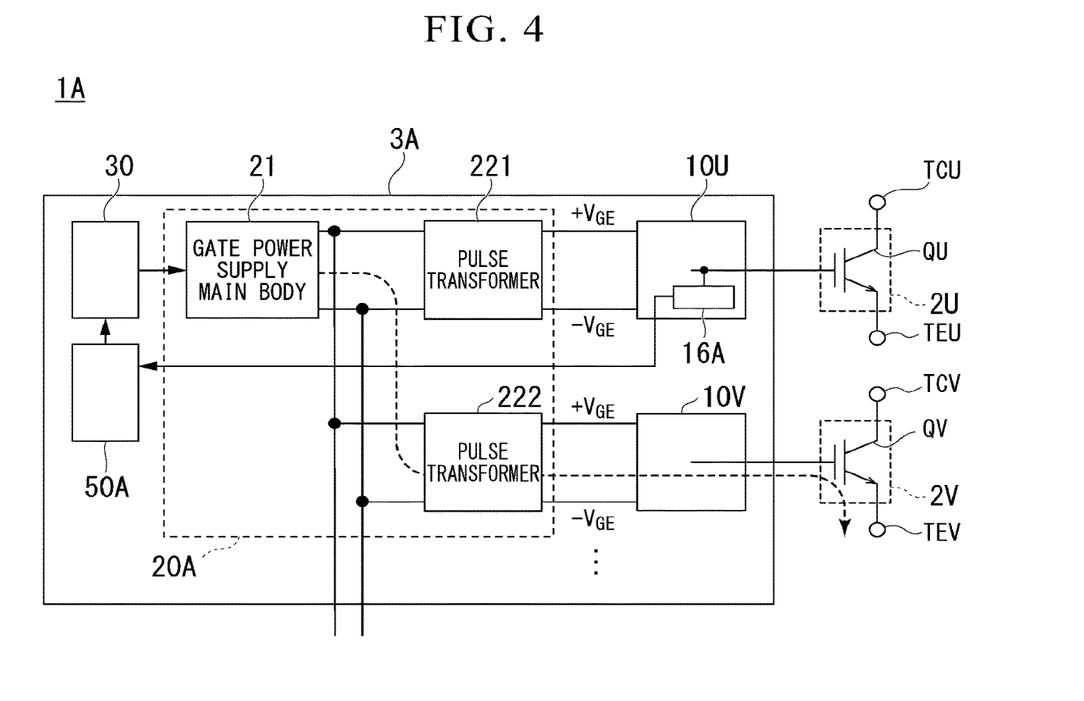
FIG. 4 is a schematic configuration diagram of a power conversion device according to a second embodiment.

FIG. 4 is a schematic configuration diagram of a power conversion device 1A according to an embodiment.

Main circuit units 2U and 2V (referred to as a first main circuit and a second main circuit) shown in FIG. 4 are examples of the main circuit unit 2 including one IGBT. The main circuit units 2U and 2V correspond to the above-described main circuit unit 2.

The main circuit units 2U and 2V include a semiconductor switch QU (a first semiconductor switch) and a semiconductor switch QV (a second semiconductor switch), respectively.

The semiconductor switch drive device 3A includes a drive circuit 10U and 10V (a first drive unit and a second drive unit), a gate power supply 20A (a power supply unit), a gate power supply protection unit 30, and a control unit 50A. The drive circuits 10U and 10V of the semiconductor switch drive device 3A are connected to an output of the control device 4, and a gate pulse GP is supplied.

The drive circuit 10U supplies a gate control signal to the semiconductor switch QU, so that the semiconductor switch QU is driven. The drive circuit 10V supplies a gate control signal to the semiconductor switch QV, so that the semiconductor switch QV is driven.

The drive circuit 10U includes a voltage detection unit 16A. The voltage detection unit 16A detects a voltage (a gate voltage) of a gate (a first control terminal) of the semiconductor switch QU. Also, the drive circuit 10V may or may not include a voltage detection unit similar to the voltage detection unit 16A. The gate of the semiconductor switch QV is an example of a second control terminal.

The gate power supply 20A supplies electric power to the drive circuits 10U and 10V.

For example, the gate power supply 20A includes a gate power supply main body 21 and pulse transformers 221 and 222 (a first pulse transformer and a second pulse transformer).

The gate power supply main body 21 forms a primary side circuit of the gate power supply 20A and supplies high-frequency pulses to the pulse transformers 221 and 222 in the subsequent stage.

The pulse transformers 221 and 222 are configured to include a primary winding and a secondary winding that are magnetically coupled and insulated from each other. The pulse transformers 221 and 222 are responsive to high-frequency pulses and are formed so that a desired amount of electric power can be converted.

For example, the pulse transformer 221 receives a high-frequency pulse supplied from the gate power supply main body 21 in the primary winding of the pulse transformer 221 and generates electric power through conversion. The pulse transformer 221 supplies electric power from its secondary winding to the drive circuit 10U. The pulse transformer 222 receives a high-frequency pulse supplied from the gate power supply main body 21 in the primary winding of the pulse transformer 222 and generates electric power through conversion. The pulse transformer 222 supplies the electric power from its secondary winding to the drive circuit 10V.

The gate power supply protection unit 30 includes a switch that cuts off the supply of electric power to the gate power supply 20A by detecting or controlling an overvoltage state on the primary side of the gate power supply 20A.

The control unit 50A may detect a short-circuit failure in the semiconductor switch QU or the semiconductor switch QV on the basis of the voltage of the gate (the gate voltage) of the semiconductor switch QU detected by the voltage detection unit 16A. The control unit 50A switches a conductive state of the switch of the gate power supply protection unit 30 on the basis of a result of detecting the voltage of the gate (the gate voltage) of the semiconductor switch QU.

The gate power supply 20A configured as described above uses the drive circuits 10U and 10V as loads. When the drive circuits 10U and 10V are balanced as loads and the magnitude of each load falls within a prescribed range, the gate power supply 20A is configured to stably supply electric power simply by driving the drive circuits 10U and 10V.

However, if a short-circuit failure occurs in either one of the semiconductor switches QU and QV driven by the drive circuits 10U and 10V, respectively, the balance of the drive circuits 10U and 10V as the loads is lost. Further, due to a short-circuit failure, the gate power supply 20A may be in an overload state and may not be able to stably supply electric power.

For example, when a short-circuit failure occurs in the semiconductor switch QV, the load current of the drive circuit 10V increases, an electric current larger than the normal current flows and the load balance is lost as described above. The gate power supply 20A is in the overload state and cannot supply sufficient electric power to the drive circuit 10U in which a short-circuit failure has not occurred. Thus, the voltage of the gate (the gate voltage) of the semiconductor switch QU detected by the voltage detection unit 16A shows a potential different from that at the normal time. When the voltage of the gate (the gate voltage) of the semiconductor switch QU is detected by the voltage detection unit 16A, it is possible to indirectly detect a short-circuit failure occurring in semiconductor switches QV having different paths.

As described above, it is possible to indirectly detect a short-circuit failure in a semiconductor switch Q of a specific path within a range even if the short-circuit failure occurs by detecting the voltage of the gate (the gate voltage) of at least one semiconductor switch QU among a plurality of paths within the range included in the range in which the gate power supply 20A supplies electric power.

According to the above-described embodiment, a semiconductor switch drive device includes a drive unit, a power supply unit, a switch, and a control unit. The drive unit supplies a control signal to a semiconductor switch of a main circuit and drives the semiconductor switch. The power supply unit supplies electric power to the drive unit. The switch cuts off supply of electric power to the power supply unit by detecting or controlling an overvoltage state on a primary side of the power supply unit. The control unit switches a conductive state of the switch on the basis of a voltage of the control signal of the semiconductor switch. Thereby, an abnormal electric current due to a control terminal short-circuit failure in the semiconductor switch can be cut off.

While several embodiments of the present invention have been described, these embodiments have been presented by way of example only, and are not intended to limit the scope of the inventions. These embodiments may be embodied in a variety of other forms. Various omissions, substitutions, and changes may be made without departing from the spirit of the inventions. The inventions described in the accompanying claims and their equivalents are intended to cover such embodiments or modifications as would fall within the scope and spirit of the inventions.

Although an example in which the semiconductor switch drive device 3 includes the control unit 50 has been described, the present invention is not limited thereto. The semiconductor switch drive device 3 and the control unit 50 may be configured separately. The same is true for the semiconductor switch drive device 3A and the control unit 50A.

REFERENCE SIGNS LIST 1, 1A Power conversion device
2 Main circuit unit (main circuit)
3 Semiconductor switch drive device
10 Drive circuit (drive unit)
16, 16A Voltage detection unit
20, 20A Gate power supply (power supply unit)
30 Gate power supply protection unit
39 Switch
50, 50A Control unit
Q Semiconductor switch
QU First semiconductor switch
QV Second semiconductor switch

The invention claimed is:

1. A semiconductor switch drive device comprising:
   a drive circuit configured to supply a control signal to a semiconductor switch of a main circuit and drive the semiconductor switch;
   a power supply circuit configured to supply electric power to the drive circuit;
   a control circuit configured, by controlling, to switch a conductive state of the semiconductor switch on the basis of a voltage at a control terminal of the semiconductor switch; and
   a gate power supply protection circuit including a second switch and configured to detect an overvoltage state and an undervoltage state on a primary side of the power supply circuit, and to cut off, by the second switch, supply of the electric power to the power supply circuit by detecting the overvoltage state, by detecting the undervoltage state, or by the controlling.

2. The semiconductor switch drive device according to claim 1,
   wherein the drive circuit negatively biases the control signal when the semiconductor switch is turned off, and wherein the control circuit causes the second switch to cut off the supply of the electric power to the power supply circuit if the voltage of the control terminal when the semiconductor switch is turned off is less than a prescribed value.

3. The semiconductor switch drive device according to claim 1, wherein an output side of the power supply circuit is insulated from a power supply of the main circuit.

4. The semiconductor switch drive device according to claim 1, wherein the semiconductor switch is an insulated gate bipolar transistor (IGBT).

5. The semiconductor switch drive device according to claim 1, comprising a voltage detection circuit configured to detect the voltage of the control terminal of the semiconductor switch.

6. A power conversion device comprising:
a first main circuit including a first semiconductor switch that is controlled according to a first control signal supplied to a first control terminal;
a first drive circuit configured to supply the first control signal to the first control terminal and drive the first semiconductor switch;
a voltage detection circuit configured to detect a voltage of the first control terminal;
a second main circuit including a second semiconductor switch that is controlled according to a second control signal supplied to a second control terminal;
a second drive circuit configured to supply the second control signal to the second control terminal and drive the second semiconductor switch;
a power supply circuit configured to supply electric power to the first drive circuit and the second drive circuit;
a control circuit configured, by controlling, to switch a conductive state of the first semiconductor switch or the second semiconductor switch on the basis of a voltage at a control terminal of the first semiconductor switch or the second semiconductor switch; and
a gate power supply protection circuit including a third switch, configured to detect an overvoltage state and an undervoltage state on a primary side of the power supply circuit, and configured to cut off, by the third switch, supply of the electric power to the power supply circuit by detecting the overvoltage state, by detecting the undervoltage state, or by the controlling.

7. The power conversion device according to claim 6, wherein the power supply circuit includes
a primary side circuit of the power supply circuit;
a first pulse transformer configured to convert electric power supplied from the primary side circuit and generate the electric power to be supplied to the first drive circuit; and
a second pulse transformer configured to convert the electric power supplied from the primary side circuit and generate the electric power to be supplied to the second drive circuit.

8. The power conversion device according to claim 6, wherein the control circuit detects a short-circuit failure in the first semiconductor switch or the second semiconductor switch on the basis of the voltage of the first control terminal that has been detected.

9. A method of controlling a semiconductor switch drive device including a drive circuit configured to supply a control signal to a semiconductor switch of a main circuit and drive the semiconductor switch, a power supply circuit configured to supply electric power to the drive circuit, and a gate power supply protection circuit configured to detect an overvoltage state and an undervoltage state on a primary side of the power supply circuit, and configured to cut off, by a second switch, supply of the electric power to the power supply circuit either by detecting the overvoltage state, by detecting the undervoltage state, or by controlling, the method comprising:
switching a conductive state of the semiconductor switch by the controlling on the basis of a voltage at a control terminal of the semiconductor switch.

\* \* \* \* \*